US012811587B2

(12) United States Patent
Harris et al.

(10) Patent No.: US 12,811,587 B2
(45) Date of Patent: Nov. 24, 2026

(54) INTEGRATED CIRCUIT OUTPUTS WITH SWITCHED SOURCE FOLLOWERS TO SUPPORT VARIABLE OUTPUT LEVELS WITHOUT DEDICATED SUPPLIES

(71) Applicant: Raytheon Company, Waltham, MA (US)

(72) Inventors: Micky R Harris, Lompoc, CA (US); Magathi J. Willis, Broomfield, CO (US)

(73) Assignee: Raytheon Company, Arlington, VA (US)

( * ) Notice: Subject to any disclaimer, the term of this patent is extended or adjusted under 35 U.S.C. 154(b) by 176 days.

(21) Appl. No.: 18/354,034

(22) Filed: Jul. 18, 2023

(65) Prior Publication Data

US 2025/0030423 A1 Jan. 23, 2025

(51) Int. Cl.
*H03K 19/01* (2006.01)
*H03K 19/0185* (2006.01)

(52) U.S. Cl.
CPC ............................ *H03K 19/018521* (2013.01)

(58) Field of Classification Search
CPC .............................................. H03K 19/018521
See application file for complete search history.

(56) References Cited

U.S. PATENT DOCUMENTS 4,791,323 A * 12/1988 Austin ................. H03K 3/3565 326/71
5,528,172 A 6/1996 Sundstrom
6,097,113 A * 8/2000 Teraoka ............. H03K 19/0013 327/544
9,240,784 B2 1/2016 Gondi et al.
2016/0180897 A1* 6/2016 Shen .................... G11C 7/1057 365/189.17
2019/0028071 A1* 1/2019 Sakai .................... H03F 3/3022

* cited by examiner

*Primary Examiner* — Daniel C Puentes

(57) ABSTRACT

An apparatus includes an output circuit configured to level-shift an incoming signal and generate an output signal having a voltage range different than a voltage range of the incoming signal. The output circuit includes an output driver configured to receive the incoming signal and generate the output signal at a specified voltage level. The output circuit also includes a switched source follower coupled to the output driver. The switched source follower is configured to receive the incoming signal and set the specified voltage level. The switched source follower may include first and second transistors, and the output driver may include a third transistor. The first and third transistors may be configured to be driven by the incoming signal. The second transistor may be configured to be driven by a gate voltage, and the specified voltage level for the output driver may be based on the gate voltage.

20 Claims, 3 Drawing Sheets

INTEGRATED CIRCUIT OUTPUTS WITH SWITCHED SOURCE FOLLOWERS TO SUPPORT VARIABLE OUTPUT LEVELS WITHOUT DEDICATED SUPPLIES

TECHNICAL FIELD

This disclosure relates generally to integrated circuits. More specifically, this disclosure relates to integrated circuit outputs with switched source followers to support variable output levels without dedicated supplies.

BACKGROUND

Semiconductor chips and other integrated circuit devices are typically designed to receive input signals from and provide output signals to external circuits or other external components. For example, integrated circuit devices often include input/output (I/O) pads, which represent conductive pads that are electrically coupled to circuit components within the integrated circuit devices. The I/O pads can be bonded or otherwise electrically connected to wires, solder bumps, printed circuit board (PCB) traces, or other conductive pathways in order to electrically couple the integrated circuit devices to external components.

SUMMARY

This disclosure relates to integrated circuit outputs with switched source followers to support variable output levels without dedicated supplies.

In a first embodiment, an apparatus includes an output circuit configured to level-shift an incoming signal and generate an output signal having a voltage range different than a voltage range of the incoming signal. The output circuit includes an output driver configured to receive the incoming signal and generate the output signal at a specified voltage level. The output circuit also includes a switched source follower coupled to the output driver, where the switched source follower is configured to receive the incoming signal and set the specified voltage level for the output driver.

In a second embodiment, a system includes an integrated circuit device having one or more input/output (I/O) pads. The system also includes at least one output circuit associated with at least one of the one or more I/O pads. Each output circuit is configured to level-shift an incoming signal received at the output circuit and generate an output signal having a voltage range different than a voltage range of the incoming signal. Each output circuit includes an output driver configured to receive the incoming signal and generate the output signal at a specified voltage level. Each output circuit also includes a switched source follower coupled to the output driver, where the switched source follower is configured to receive the incoming signal and set the specified voltage level for the output driver.

In a third embodiment, a method includes receiving an incoming signal. The method also includes level-shifting the incoming signal to generate an output signal having a voltage range different than a voltage range of the incoming signal using an output circuit. The output circuit includes an output driver that receives the incoming signal and generates the output signal at a specified voltage level. The output circuit also includes a switched source follower coupled to the output driver, where the switched source follower receives the incoming signal and sets the specified voltage level for the output driver.

Other technical features may be readily apparent to one skilled in the art from the following figures, descriptions, and claims.

BRIEF DESCRIPTION OF THE DRAWINGS

For a more complete understanding of this disclosure, reference is made to the following description, taken in conjunction with the accompanying drawings, in which.

DETAILED DESCRIPTION

Figure 1:
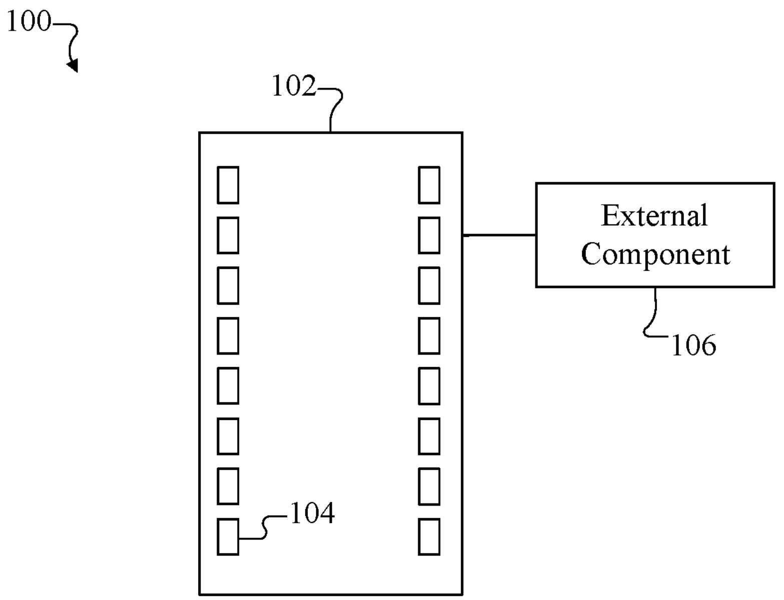
FIG. 1 illustrates an example integrated circuit device having one or more integrated circuit outputs with at least one switched source follower to support variable output levels without dedicated supplies according to this disclosure.

FIGS. 1 through 4, described below, and the various embodiments used to describe the principles of the present disclosure are by way of illustration only and should not be construed in any way to limit the scope of this disclosure. Those skilled in the art will understand that the principles of the present disclosure may be implemented in any type of suitably arranged device or system.

As noted above, semiconductor chips and other integrated circuit devices are typically designed to receive input signals from and provide output signals to external circuits or other external components. For example, integrated circuit devices often include input/output (I/O) pads, which represent conductive pads that are electrically coupled to circuit components within the integrated circuit devices. The I/O pads can be bonded or otherwise electrically connected to wires, solder bumps, printed circuit board (PCB) traces, or other conductive pathways in order to electrically couple the integrated circuit devices to external components.

It is common for semiconductor chips and other integrated circuit devices to generate output signals having voltages at specified voltage levels that are different than voltage levels used by external circuits or other external components interacting with the integrated circuit devices. For example, an integrated circuit device may internally generate an output signal ranging from 0 volts to 1.2 volts, but an external component may expect to receive an output signal ranging from 0 volts to 1.8 volts, 2.1 volts, 3.6 volts, or more. Because of this, output circuits used in integrated circuit devices may need to level-shift output signals to different voltage levels. This is typically accomplished using an external voltage supply or an internal regulated voltage supply, such as one that can be used to generate a higher voltage level for a level-shifted output signal.

Unfortunately, the use of an external voltage supply often requires the presence of additional I/O pads in order to receive a voltage from the external voltage supply, and the use of an internal regulated voltage supply often requires the inclusion of an on-chip voltage regulator. When an integrated circuit device might need to generate output signals at multiple other voltage levels, the integrated circuit device may need multiple external voltage supplies or multiple internal regulated voltage supplies. As a result, these approaches can significantly increase the size, weight, power, and cost of the integrated circuit device. Moreover, it is common for banks of multiple outputs to be used together, where the voltage level of all outputs in the bank are collectively set to the same voltage level. This prevents different outputs from generating output signals at different voltage levels.

This disclosure provides integrated circuit outputs with switched source followers to support variable output levels without dedicated supplies. As described in more detail below, an output circuit for a semiconductor device or other integrated circuit device includes a first switched source follower and an output driver. The first switched source follower can be configured to set an output voltage level for the output driver and to act as a pull-up element for the output driver. The first switched source follower may be formed using first and second transistors coupled in series, and the output driver may be formed using a third transistor coupled in series with the first switched source follower. The first and third transistors can be driven by an incoming signal. The second transistor can be driven using a first gate voltage that acts as a gate bias for the second transistor, which in some cases may effectively set the gate of the second transistor at a high logic level. The first gate voltage can be fixed or adjustable, and the first gate voltage may be generated using a voltage already present in the integrated circuit device. An output signal can be generated by the output driver based on the incoming signal, where the output signal represents a level-shifted version of the incoming signal. Optionally, a second switched source follower may be coupled in parallel across the first switched source follower. The second switched source follower may be formed using fourth and fifth transistors coupled in series. The fourth transistor may be driven by a delayed version of the incoming signal, and the fifth transistor may be driven by a second gate voltage different than the first gate voltage. The second gate voltage may be higher than the first gate voltage, which can provide a higher bias for the fifth transistor compared to the second transistor. The output circuit may be replicated across any desired number of integrated circuit device outputs.

The output circuit here therefore operates to convert an incoming signal (which can have voltages spanning a first voltage range) into an output signal (which can have voltages spanning a second voltage range different than the first voltage range), thereby providing level-shifting of the incoming signal. The first voltage range can be fixed based on a voltage used within the integrated circuit device, and the second voltage range can be variable or unknown ahead of time and may be based on one or more external components to be coupled to the output circuit. As a particular example, the output circuit may be used to level-shift an incoming signal having a voltage up to 1.2 volts to an output signal having a voltage up to 1.8 volts (although these values are for illustration only). Note that the term "span" here can encompass a range between two voltages inclusive or exclusive of those two voltages.

In this way, the output circuit is able to perform level-shifting in order to allow the associated integrated circuit device to be used with various external components that expect one or more different output voltage levels. Also, this level-shifting can be achieved using an output circuit that is smaller and less complex than conventional circuits, which can help to reduce the size, weight, power, and cost of the integrated circuit device. This can be particularly beneficial when an integrated circuit device includes numerous output circuits. Among other things, this can be achieved since each gate voltage used with the switched source follower(s) of an output circuit can represent a lower-power bias voltage, and bias voltages are generally much simpler to implement that power supply voltages. Moreover, each output circuit is able to provide both level-shifting and output driving within the same circuit, which can further simplify the overall design. Further, it is possible to separately control each output circuit within a bank of output circuits, meaning each output circuit can be controlled independently to generate an output signal at a suitable voltage level. In addition, in some embodiments, the second switched source follower can be used to provide additional pre-emphasis and achieve faster switching speeds for the output circuit.

FIG. 1 illustrates an example integrated circuit device 100 having one or more integrated circuit outputs with at least one switched source follower to support variable output levels without dedicated supplies according to this disclosure. As shown in FIG. 1, the integrated circuit device 100 is formed using a semiconductor chip 102 having one or more I/O pads 104. The semiconductor chip 102 represents an integrated circuit device that can generate at least one output signal, where the at least one output signal may need to undergo level-shifting from one or more voltage levels associated with the integrated circuit device 100 to one or more other voltage levels. In this example, the integrated circuit device 100 takes the form of a rectangular semiconductor chip 102, although the integrated circuit device 100 may have any other suitable form. The semiconductor chip 102 includes any suitable integrated circuit device having one or more outputs. As particular (non-limiting) examples, the semiconductor chip 102 may represent a microprocessor, microcontroller, digital signal processor (DSP), application-specific integrated circuit (ASIC), field programmable gate array (ASIC), memory chip, or specialty semiconductor chip.

Each I/O pad 104 represents a conductive structure on or in the semiconductor chip 102. Each I/O pad 104 is electrically coupled to one or more circuit components within the semiconductor chip 102. Each I/O pad 104 can also be bonded or otherwise electrically connected to a wire, solder bump, PCB trace, or other conductive pathway. This allows each V/O pad 104 to receive an input signal (such as a data or power signal) for or provide an output signal from one or more circuit components within the semiconductor chip 102. Among other things, this enables the semiconductor chip 102 to interact with one or more external components 106. While a single external component 106 is shown here, the semiconductor chip 102 may be coupled to any suitable number of external components 106. Each external component 106 may represent another circuit component or other electrical device or system that can interact with the integrated circuit device 100. Note that the number and arrangement of the I/O pads 104 shown here are for illustration only. The semiconductor chip 102 may include any suitable number of I/O pads 104 in any suitable arrangement. The I/O pads 104 may also be positioned on any suitable surface(s) of the semiconductor chip 102.

As described in more detail below, each I/O pad 104 used for output may be coupled to an output circuit that supports level-shifting to different voltage levels. For example, each output circuit may be configured to level-shift an incoming signal (which may represent a signal provided by another component of the integrated circuit device 100) from a voltage level used by the integrated circuit device 100 to a voltage level used by an external component 106. As a particular example, the semiconductor chip 102 may operate using a voltage of 1.2 volts, while an external component 106 may expect to receive an output signal from the semiconductor chip 102 having a voltage up to 1.8 volts to 3.6 volts. Each output circuit can be used to support level-shifting while obtaining various advantages, such as a simplified design, independent output channel control, improved switching speed, or any combination thereof. Moreover, this level-shifting may be achieved using one or more voltages already present within the integrated circuit device 100, meaning no dedicated voltage supplies (like external voltage supplies or internal regulated voltage supplies) may be needed just for the level-shifting. As particular examples, the semiconductor chip 102 may operate using 1.2-volt and 3.3-volt supply voltages, and an output circuit may be configured to level-shift an incoming signal from 1.2 volts to 1.8 volts or 2.1 volts (without using an internal or external 1.8-volt or 2.1-volt power supply).

Although FIG. 1 illustrates one example of an integrated circuit device 100 having one or more integrated circuit outputs with at least one switched source follower to support variable output levels without dedicated supplies, various changes may be made to FIG. 1. For example, the integrated circuit device 100 may have any other suitable form or design. In general, an integrated circuit output with at least one switched source follower to support variable output levels without a dedicated supply may be used with any suitable integrated circuit devices.

Figure 2A:
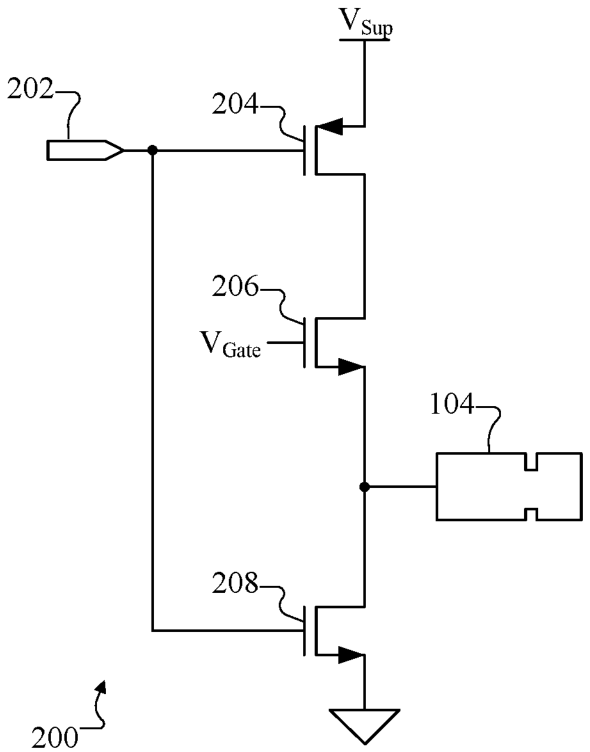
FIGS. 2A and 2B illustrate example integrated circuit outputs with switched source followers to support variable output levels without dedicated supplies according to this disclosure.
Figure 2B:
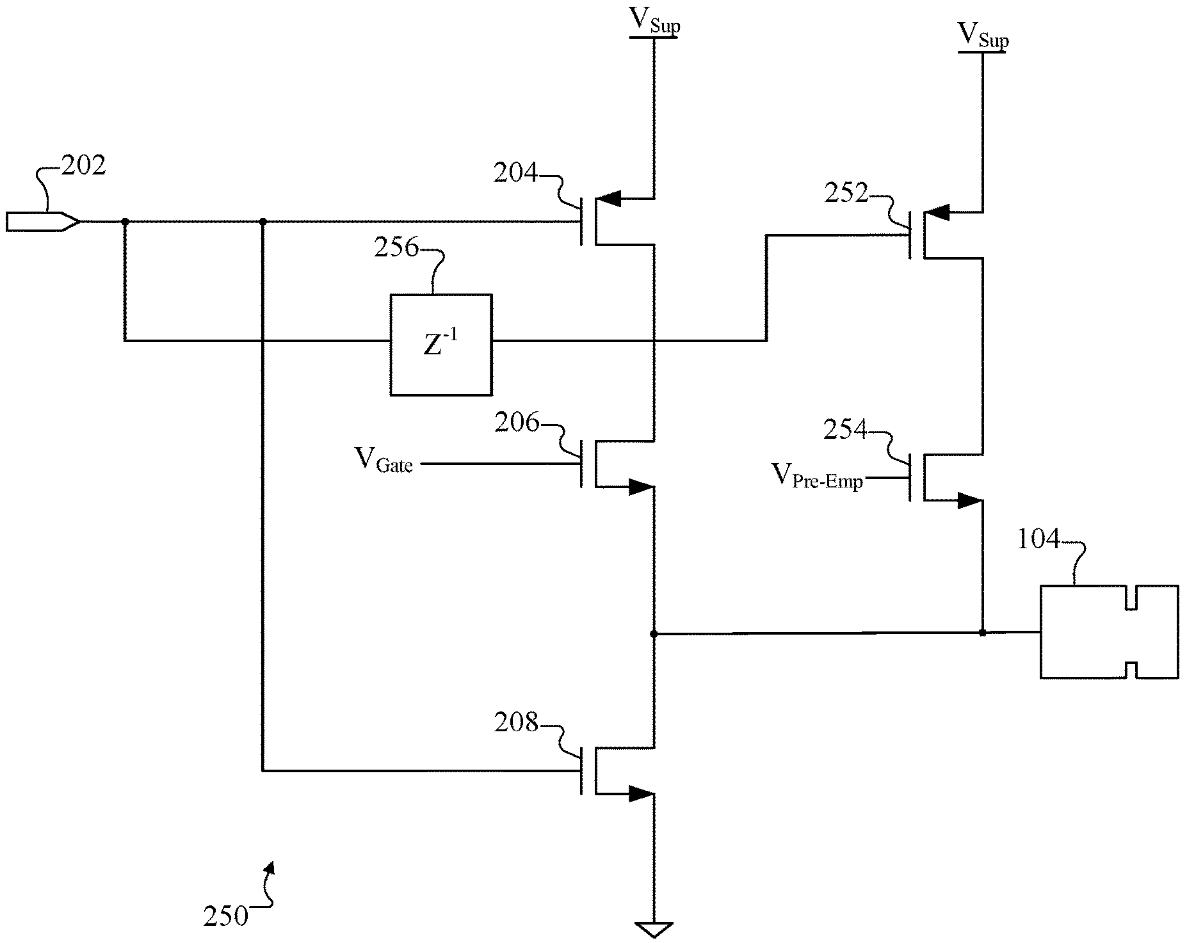

FIGS. 2A and 2B illustrate example integrated circuit outputs 200 and 250 with switched source followers to support variable output levels without dedicated supplies according to this disclosure. For ease of explanation, the integrated circuit outputs 200 and 250 shown in FIGS. 2A and 2B are described as being used in the integrated circuit device 100 shown in FIG. 1. However, the integrated circuit outputs 200 and 250 may be used with any other suitable device or system.

As shown in FIG. 2A, the integrated circuit output 200 represents an output circuit that includes or is used in conjunction with an I/O pad 104 that provides an outgoing output signal. The outgoing output signal is generated based on an incoming signal 202, where the incoming signal 202 may represent a signal from another component or components of the integrated circuit device 100. In this example, the output signal is generated based on the incoming signal 202 using a switched source follower and an output driver. The switched source follower in this example is formed using a first transistor 204 coupled in series with a second transistor 206. The output driver in this example is formed using a third transistor 208, which is coupled in series with the first and second transistors 204 and 206.

Each of the transistors 204-208 includes any suitable structure configured to selectively pass or block an electrical signal. As a particular example, each of the transistors 204-208 may represent a complementary metal oxide semiconductor (CMOS) transistor, such as a p-type metal oxide semiconductor (PMOS) or n-type metal oxide semiconductor (NMOS) transistor. In this embodiment, the transistor 204 represents a PMOS transistor, and the transistors 206 and 208 represent NMOS transistors. Each transistor 204-208 used here may have any suitable form, such as a native device or a transistor having a standard threshold voltage.

In the example shown in FIG. 2A, the incoming signal 202 is provided to the gates of the transistors 204 and 208, meaning the transistors 204 and 208 are driven using the incoming signal 202. A gate voltage $V_{Gate}$ is provided to the gate of the transistor 206, meaning the transistor 206 is driven using the gate voltage $V_{Gate}$. The gate voltage $V_{Gate}$ here acts as a gate bias for the transistor 206. In some cases, this may effectively set the gate of the transistor 206 at a high logic level. The gate voltage $V_{Gate}$ may be generated in any suitable manner, and the gate voltage $V_{Gate}$ may be fixed or adjustable depending on the implementation. For instance, in some embodiments, the gate voltage $V_{Gate}$ may be generated using a low-power on-chip or other digital-to-analog converter (DAC), in which case the gate voltage $V_{Gate}$ may be programmable or adjustable In other embodiments, the gate voltage V Gate may be generated using a resistive voltage divider, in which case the gate voltage $V_{Gate}$ may be fixed. In many cases, the gate voltage $V_{Gate}$ may be generated using the common high voltage supply used by the integrated circuit device 100 without requiring the use of a dedicated external or internal power supply for the level-shifting. Note, however, that the gate voltage $V_{Gate}$ may be generated in any other suitable manner.

However the gate voltage $V_{Gate}$ is generated, the gate voltage $V_{Gate}$ can be applied to the gate of the transistor 206 in order to drive the transistor 206. The transistors 204 and 206 are said to form a switched source follower since (i) the transistor 206 can act as a source follower and (ii) the transistor 204 can selectively pass a supply voltage $V_{Sup}$ to the transistor 206 or block the supply voltage $V_{Sup}$ from the transistor 206 in a switchable manner. The output driver is generally used to produce the output signal on the I/O) pad 104 based on the incoming signal 202 and the output from the switched source follower. Here, the switched source follower can set an output level of the output signal generated by the output driver and can act as a pull-up element for the output driver.

As shown in FIG. 2B, the integrated circuit output 250 includes many of the same components as the integrated circuit output 200. In this example, the transistors 204-206 form a first switched source follower, and a second switched source follower is coupled in parallel with the first switched source follower. In this example, the second switched source follower is formed using a fourth transistor 252 coupled in series with a fifth transistor 254. Each of the transistors 252-254 includes any suitable structure configured to selectively pass or block an electrical signal. As a particular example, each of the transistors 252-254 may represent a CMOS transistor, such as a PMOS or NMOS transistor. In this embodiment, the transistor 252 represents a PMOS transistor, and the transistor 254 represents an NMOS transistor. Each transistor 252-254 used here may have any suitable form, such as a native device or a transistor having a standard threshold voltage.

In this example, a delay element 256 is used to create a delayed version of the incoming signal 202, and the transistor 252 is driven by the delayed version of the incoming signal 202. Also, the transistor 254 is driven by a gate voltage $V_{Pre\text{-}Emp}$ that is different than the gate voltage $V_{Gate}$. In some cases, the gate voltage $V_{Pre\text{-}Emp}$ can be higher than the gate voltage $V_{Gate}$, which provides a higher bias for the transistor 254 compared to the transistor 206. This approach uses the second switched source follower as a secondary path within the integrated circuit output 250, which can be used to provide pre-emphasis in order to obtain higher switching speeds. The delay element 256 may represent any suitable structure configured to delay an electrical signal. In some cases, the delay element 256 may represent an elongated electrical trace that delays an electrical signal due to the time needed for the electrical signal to travel along the trace. However, any other suitable active or passive delay element may be used here.

In both integrated circuit outputs 200 and 250, it can be seen that the integrated circuit outputs 200 and 250 do not require direct current (DC) power except when switching, which can be beneficial compared to using a dedicated output supply for the level-shifting. Moreover, the integrated circuit outputs 200 and 250 can be implemented in a straight-forward manner and may require little area for implementation, which can reduce space used (particularly when the integrated circuit outputs 200 and 250 are replicated across multiple outputs). Further, when the integrated circuit outputs 200 and 250 are replicated across multiple outputs, the integrated circuit outputs 200 and 250 can be controlled individually and independently, such as by controlling how the gate voltage $V_{Gate}$ is generated (and optionally how the gate voltage $V_{Pre\text{-}Emp}$ is generated) in each integrated circuit output 200 and 250. It may even be possible to configure all of the integrated circuit outputs 200 and 250 to use different discrete voltage levels. This type of functionality is not possible in traditional approaches where there is one power supply voltage per bank of outputs.

In some embodiments, the incoming signal 202 provided to the integrated circuit output 200 or 250 may span a voltage from 0 volts to 1.2 volts, although any other suitable voltage range may be used by the integrated circuit device 100. The integrated circuit output 200 or 250 can level-shift the incoming signal 202 in order to generate an output signal provided on the I/O pad 104 with a different voltage range. For example, the output signal can include voltages spanning a range from 0 volts to 1.8 volts, 0 volts to 2.1 volts, 0 volts to 3.6 volts, or other specified voltage levels. The actual voltage range used for the output signal provided on the I/O pad 104 can be controlled using the gate voltage $V_{Gate}$ (and optionally the gate voltage $V_{Pre\text{-}Emp}$). Also, the output swing of the output signal may only be limited by the supply voltage $V_{Sup}$.

As a particular example of this functionality, assume an integrated circuit device (such as a read-out integrated circuit or "ROIC") may receive or internally generate supply voltages of 3.3 volts and 1.2 volts. Also assume that the ROIC is intended for use with an external component 106, such as an FPGA, representing a 1.8-volt CMOS device. In this particular example, a 3.3-volt supply voltage of the ROIC may be used to generate the gate voltage $V_{Gate}$ (and optionally the gate voltage $V_{Pre\text{-}Emp}$), rather than using a dedicated internal or external 1.8-volt power supply. As a result, the integrated circuit output 200 or 250 may operate to level-shift a 1.2-volt signal generated by the ROIC into a corresponding 1.8-volt signal provided to the FPGA. This level-shifting can be accomplished without using any power supplies dedicated solely to achieving the desired voltage level for the FPGA, meaning no separate 1.8-volt power supply is needed.

Although FIGS. 2A and 2B illustrate examples of integrated circuit outputs 200 and 250 with switched source followers to support variable output levels without dedicated supplies, various changes may be made to FIGS. 2A and 2B. For example, while specific components in the integrated circuit outputs 200 and 250 are shown in FIGS. 2A and 2B, other circuit components configured to perform the same or similar functions may be used here.

Figure 3A:
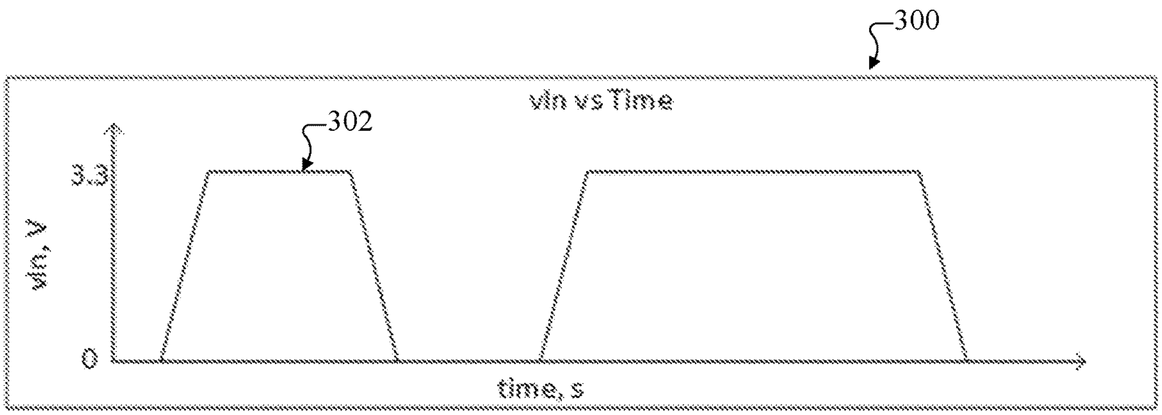
FIGS. 3A and 3B illustrate example timing diagrams for an integrated circuit output with at least one switched source follower to support variable output levels without a dedicated supply according to this disclosure.
Figure 3B:
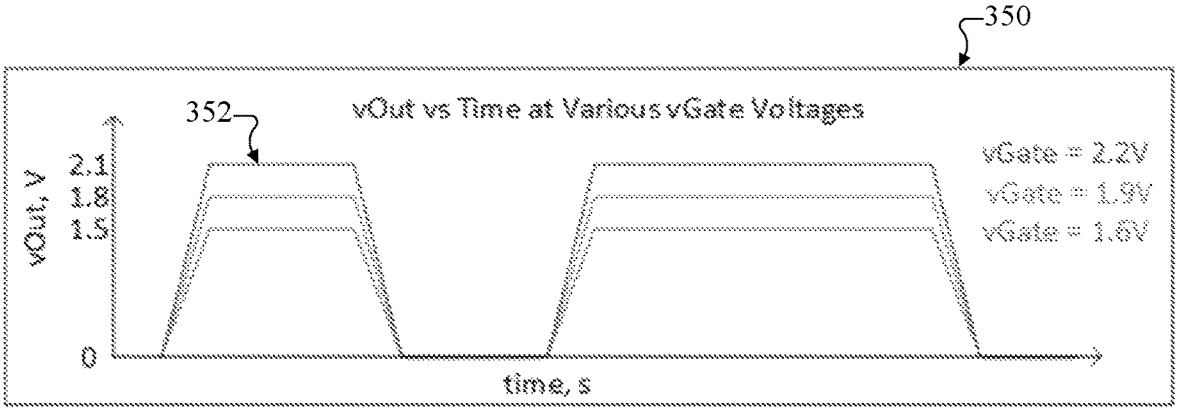

FIGS. 3A and 3B illustrate example timing diagrams 300 and 350 for an integrated circuit output with at least one switched source follower to support variable output levels without a dedicated supply according to this disclosure. For ease of explanation, the timing diagrams 300 and 350 shown in FIGS. 3A and 3B are described as being associated with the integrated circuit output 200 shown in FIG. 2A, which can be used in the integrated circuit device 100 shown in FIG. 1. However, the timing diagrams 300 and 350 may represent the operation of any other suitable output circuit (including the integrated circuit output 250), and the output circuit may be used with any other suitable device or system.

As shown in FIGS. 3A and 3B, the timing diagrams 300 and 350 respectively include an incoming signal 302 and a corresponding output signal 352. The incoming signal 302 represents a signal provided by the integrated circuit device 100 to an integrated circuit output 200 or 250, such as the incoming signal 202. The output signal 352 represents a signal generated by the integrated circuit output 200 or 250 in the integrated circuit device 100 for output over an associated I/O pad 104. For instance, the output signal 352 can be provided from the integrated circuit output 200 to one or more external components 106 for use. The actual usage of the output signal 352 can vary widely depending on the implementation.

As can be seen in FIG. 3A, the incoming signal 302 varies between two voltage levels, namely about 3.3 volts and about 0 volts in this example. As can be seen in FIG. 3B, the output signal 352 also varies between two voltage levels, but at least one of the voltage levels of the output signal 352 differs from the corresponding voltage level of the incoming signal 302. For example, in FIG. 3B, the output signal 352 may have an upper voltage level of about 1.6 volts, about 1.9 volts, or about 2.2 volts. These upper voltage levels for the output signal 352 may be obtained by adjusting the gate voltage $V_{Gate}$ (and optionally the gate voltage $V_{Pre\text{-}Emp}$) as described above. This causes the switched source follower or the first switched source follower (formed using the transistors 204-206) to set the desired output level of the output driver (formed using the transistor 208). Note that these voltages are examples only and can vary depending on the implementation. Also, in some cases, the different maximum voltages generated using the integrated circuit outputs 200 or 250 may be defined according to different I/O voltage standards, such as different standards associated with different external components 106 or different types of external components 106.

Although FIGS. 3A and 3B illustrate examples of timing diagrams 300 and 350 for an integrated circuit output 200 or 250 with at least one switched source follower to support variable output levels without a dedicated supply, various changes may be made to FIGS. 3A and 3B. For example, the specific signals shown in FIGS. 3A and 3B are examples only, and the incoming signals provided to and the output signals generated by an integrated circuit output 200 or 250 can vary widely depending on the circumstances. FIGS. 3A and 3B are merely meant to illustrate one example of the type of level-shifting that can be achieved using the integrated circuit output 200 or 250.

Figure 4:
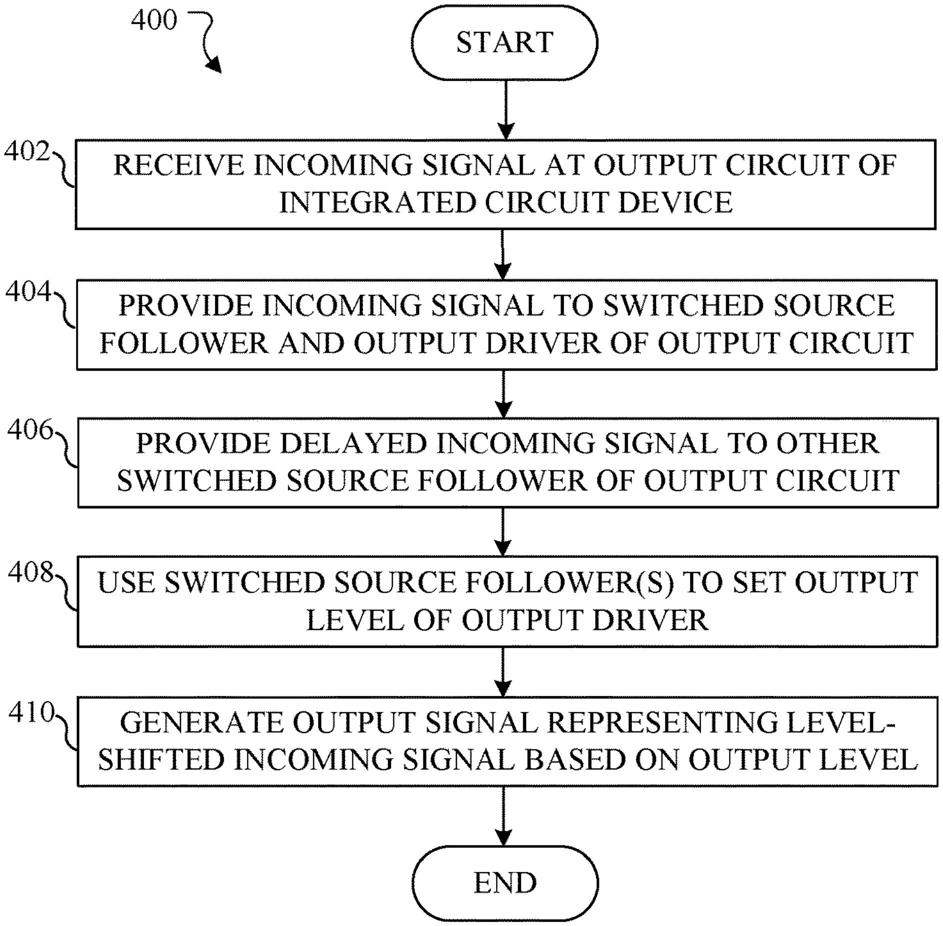
FIG. 4 illustrates an example method for providing variable output levels using an integrated circuit output with at least one switched source follower and without a dedicated supply according to this disclosure.

FIG. 4 illustrates an example method 400 for providing variable output levels using an integrated circuit output with at least one switched source follower and without a dedicated supply according to this disclosure. For ease of explanation, the method 400 shown in FIG. 4 is described as being performed using the integrated circuit output 200 or 250 shown in FIG. 2A or 2B within the integrated circuit device 100 shown in FIG. 1. However, the method 400 may be used with any other suitable input circuit, device, or system.

As shown in FIG. 4, an incoming signal is received at an output circuit of an integrated circuit device at step 402. This may include, for example, the integrated circuit output 200 or 250 receiving an incoming signal 202 from one or more other components of the integrated circuit device 100. The incoming signal is provided to a switched source follower and an output driver of the output circuit at step 404. This may include, for example, the gate of the first transistor 204 and the gate of the third transistor 208 receiving the incoming signal 202, thereby allowing the incoming signal 202 to drive the transistors 204 and 208. The second transistor 206 can be driven by a suitable gate voltage $V_{Gate}$, which can be based on the desired output to be generated by the output circuit.

Optionally, a delayed version of the incoming signal may be provided to another switched source follower of the output circuit at step 406. This may include, for example, generating a delayed version of the incoming signal 202 using the delay element 256. This may also include providing the delayed version of the incoming signal 202 to the gate of the fifth transistor 254, thereby allowing the delayed version of the incoming signal 202 to drive the fifth transistor 254. The fourth transistor 252 can be driven by a suitable gate voltage $V_{Pre\text{-}Emp}$, which again can be based on the desired output to be generated by the output circuit.

The switched source follower or followers are used to set the output level of the output driver at step 408. This may include, for example, the switched source follower or the first and second switched source followers generating a voltage based on the supply voltage $V_{Sup}$ and the gate voltage $V_{Gate}$ (and optionally the gate voltage $V_{Pre\text{-}Emp}$) The output level of the output driver may represent the maximum voltage that the output driver may include in the output signal provided to the I/O pad 104. In some cases, the output level of the output driver can be higher (and in some instances significantly higher) than the voltage level of the incoming signal 202.

An output signal representing a level-shifted version of the incoming signal is generated at step 410. This may include, for example, the output driver generating an output signal having the output level as defined by the switched source follower(s). The integrated circuit output 200 or 250 here is able to level-shift the incoming signal 202 to produce the output signal, even if the output signal is 1.5 times, double, triple, or even higher than the voltage level of the incoming signal 202. In general, this disclosure is not limited to any specific voltage range for the incoming signal or the output signal.

Although FIG. 4 illustrates one example of a method 400 for providing variable output levels using an integrated circuit output with at least one switched source follower and without a dedicated supply, various changes may be made to FIG. 4. For example, while shown as a series of steps, various steps in FIG. 4 may overlap, occur in parallel, occur in a different order, or occur any number of times (including zero times).

Note that while the description above has provided specific numerical values for different features, these numerical values are examples only. For instance, the description above has provided specific numerical values for various incoming and output voltages. However, these numerical values are for illustration and explanation only and do not limit the scope of this disclosure to those specific voltages. Moreover, the specific numerical values given above are approximate values only and can vary based on various factors, such as manufacturing tolerances and environmental conditions.

The following describes example embodiments of this disclosure that implement or relate to switched source followers for variable output levels without dedicated supplies. However, other embodiments may be used in accordance with the teachings of this disclosure.

In a first embodiment, an apparatus includes an output circuit configured to level-shift an incoming signal and generate an output signal having a voltage range different than a voltage range of the incoming signal. The output circuit includes an output driver configured to receive the incoming signal and generate the output signal at a specified voltage level. The output circuit also includes a switched source follower coupled to the output driver, where the switched source follower is configured to receive the incoming signal and set the specified voltage level for the output driver.

Any single one or any suitable combination of the following features may be used with the first embodiment. The switched source follower may include first and second transistors coupled in series with one another. The output driver may include a third transistor coupled in series with the first and second transistors. The first and third transistors may be configured to be driven by the incoming signal. The second transistor may be configured to be driven by a gate voltage, and the specified voltage level for the output driver may be based on the gate voltage. The switched source follower may include a first switched source follower. The output circuit may further include at least one additional switched source follower coupled in parallel with the first switched source follower. Each additional switched source follower may include two additional transistors coupled in series with one another. One of the two additional transistors may be configured to be driven by a delayed version of the incoming signal. Another of the two additional transistors may be configured to be driven by a second gate voltage. The second gate voltage may be higher than the gate voltage of the second transistor. The output circuit may lack an input to receive the specified voltage level from an external voltage supply and may lack an internal regulated voltage supply that generates the specified voltage level.

In a second embodiment, a system includes an integrated circuit device having one or more I/O pads. The system also includes at least one output circuit associated with at least one of the one or more I/O pads. Each output circuit is configured to level-shift an incoming signal received at the output circuit and generate an output signal having a voltage range different than a voltage range of the incoming signal. Each output circuit includes an output driver configured to receive the incoming signal and generate the output signal at a specified voltage level. Each output circuit also includes a switched source follower coupled to the output driver, where the switched source follower is configured to receive the incoming signal and set the specified voltage level for the output driver.

Any single one or any suitable combination of the following features may be used with the second embodiment. In each output circuit, the switched source follower may include first and second transistors coupled in series with one another, and the output driver may include a third transistor coupled in series with the first and second transistors. In each output circuit, the first and third transistors may be configured to be driven by the incoming signal, the second transistor may be configured to be driven by a gate voltage, and the specified voltage level for the output driver may be based on the gate voltage. In each output circuit, the switched source follower may include a first switched source follower, and at least one additional switched source follower may be coupled in parallel with the first switched source follower. In each output circuit, each additional switched source follower may include two additional transistors coupled in series with one another, one of the two additional transistors may be configured to be driven by a delayed version of the incoming signal, and another of the two additional transistors may be configured to be driven by a second gate voltage. In each output circuit, the second gate voltage may be higher than the gate voltage of the second transistor. The integrated circuit device may include multiple I/O pads, and multiple output circuits may be associated with two or more of the I/O pads. The gate voltage in each output circuit may be independently controllable such that different output circuits can be configurable to use different specified voltage levels. Each output circuit may lack an input to receive the specified voltage level from an external voltage supply and may lack an internal regulated voltage supply that generates the specified voltage level.

In a third embodiment, a method includes receiving an incoming signal. The method also includes level-shifting the incoming signal to generate an output signal having a voltage range different than a voltage range of the incoming signal using an output circuit. The output circuit includes an output driver that receives the incoming signal and generates the output signal at a specified voltage level. The output circuit also includes a switched source follower coupled to the output driver, where the switched source follower receives the incoming signal and sets the specified voltage level for the output driver.

Any single one or any suitable combination of the following features may be used with the third embodiment. The switched source follower may include first and second transistors coupled in series with one another. The output driver may include a third transistor coupled in series with the first and second transistors. The first and third transistors may be driven by the incoming signal. The second transistor may be driven by a gate voltage, and the specified voltage level for the output driver may be based on the gate voltage. The switched source follower may include a first switched source follower. The output circuit may further include at least one additional switched source follower coupled in parallel with the first switched source follower. Each additional switched source follower may include two additional transistors coupled in series with one another. One of the two additional transistors may be configured to be driven by a delayed version of the incoming signal. Another of the two additional transistors may be configured to be driven by a second gate voltage. The second gate voltage may be higher than the gate voltage of the second transistor.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present disclosure should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device." "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:

an output circuit configured to level-shift an incoming signal and generate an output signal having a voltage range different than a voltage range of the incoming signal, the output circuit comprising:

an output driver configured to receive the incoming signal and generate the output signal at a specified voltage level;

a first switched source follower coupled to the output driver, the first switched source follower configured to receive the incoming signal and set the specified voltage level for the output driver; and at least one additional switched source follower coupled in parallel with the first switched source follower, each additional switched source follower comprising a p-type metal oxide semiconductor (PMOS) transistor and an n-type metal oxide semiconductor (NMOS) transistor coupled in series with one another, wherein the at least one additional switched source follower is configured to receive a delayed version of the incoming signal.

2. The apparatus of claim 1, wherein:

the first switched source follower comprises first and second transistors coupled in series with one another; and the output driver comprises a third transistor coupled in series with the first and second transistors.

3. The apparatus of claim 2, wherein:

the first and third transistors are configured to be driven by the incoming signal; and the second transistor is configured to be driven by a gate voltage, the specified voltage level for the output driver based on the gate voltage.

4. The apparatus of claim 3, wherein, in each additional switched source follower:

the PMOS transistor is configured to be driven by a delayed version of the incoming signal; and the NMOS transistor is configured to be driven by a second gate voltage.

5. The apparatus of claim 4, wherein the second gate voltage is higher than the gate voltage of the second transistor.

6. The apparatus of claim 1, wherein the output circuit lacks an input to receive the specified voltage level from an external voltage supply and lacks an internal regulated voltage supply that generates the specified voltage level.

7. The apparatus of claim 2, wherein:

the first transistor is a PMOS transistor; and the second transistor is an NMOS transistor.

8. A system comprising:

an integrated circuit device comprising one or more input/output (I/O) pads; and at least one output circuit associated with at least one of the one or more I/O pads, each output circuit configured to level-shift an incoming signal received at the output circuit and generate an output signal having a voltage range different than a voltage range of the incoming signal, each output circuit comprising:

an output driver configured to receive the incoming signal and generate the output signal at a specified voltage level;

a first switched source follower coupled to the output driver, the first switched source follower configured to receive the incoming signal and set the specified voltage level for the output driver; and at least one additional switched source follower coupled in parallel with the first switched source follower, each additional switched source follower comprising a p-type metal oxide semiconductor (PMOS) transistor and an n-type metal oxide semiconductor (NMOS) transistor coupled in series with one another, wherein the at least one additional switched source follower is configured to receive a delayed version of the incoming signal.

9. The system of claim 8, wherein, in each output circuit:

the first switched source follower comprises first and second transistors coupled in series with one another; and the output driver comprises a third transistor coupled in series with the first and second transistors.

10. The system of claim 9, wherein, in each output circuit:

the first and third transistors are configured to be driven by the incoming signal; and the second transistor is configured to be driven by a gate voltage, the specified voltage level for the output driver based on the gate voltage.

11. The system of claim 10, wherein, in each additional switched source follower of each output circuit:

the PMOS transistor is configured to be driven by a delayed version of the incoming signal; and the NMOS transistor is configured to be driven by a second gate voltage.

12. The system of claim 11, wherein, in each output circuit, the second gate voltage is higher than the gate voltage of the second transistor.

13. The system of claim 10, wherein:

the integrated circuit device comprises multiple I/O pads; and multiple output circuits are associated with two or more of the I/O pads.

14. The system of claim 13, wherein the gate voltage in each output circuit is independently controllable such that different output circuits are configurable to use different specified voltage levels.

15. The system of claim 8, wherein each output circuit lacks an input to receive the specified voltage level from an external voltage supply and lacks an internal regulated voltage supply that generates the specified voltage level.

16. The system of claim 9, wherein:

the first transistor is a PMOS transistor; and the second transistor is an NMOS transistor.

17. A method comprising:

receiving an incoming signal; and level-shifting the incoming signal to generate an output signal having a voltage range different than a voltage range of the incoming signal using an output circuit;

wherein the output circuit comprises:

an output driver that receives the incoming signal and generates the output signal at a specified voltage level;

a first switched source follower coupled to the output driver, wherein the first switched source follower receives the incoming signal and sets the specified voltage level for the output driver; and at least one additional switched source follower coupled in parallel with the first switched source follower, each additional switched source follower comprising a p-type metal oxide semiconductor (PMOS) transistor and an n-type metal oxide semiconductor (NMOS) transistor coupled in series with one another, wherein the at least one additional switched source follower is configured to receive a delayed version of the incoming signal.

18. The method of claim 17, wherein:

the first switched source follower comprises first and second transistors coupled in series with one another;

the output driver comprises a third transistor coupled in series with the first and second transistors;

the first and third transistors are driven by the incoming signal; and the second transistor is driven by a gate voltage, the specified voltage level for the output driver based on the gate voltage.

19. The method of claim 18, wherein, in each additional switched source follower:

the PMOS transistor is configured to be driven by a delayed version of the incoming signal; and the NMOS transistor is configured to be driven by a second gate voltage.

20. The method of claim 19, wherein the second gate voltage is higher than the gate voltage of the second transistor.

* * * * *